United States Patent
Huang et al.

(10) Patent No.: US 6,271,581 B2
(45) Date of Patent: *Aug. 7, 2001

(54) SEMICONDUCTOR PACKAGE STRUCTURE HAVING UNIVERSAL LEAD FRAME AND HEAT SINK

(75) Inventors: Chien-Ping Huang, Hsinchu Hsien; Wei-Chen Tseng, Feng-Yuan, both of (TW)

(73) Assignee: Siliconware Precision Industries Co., Ltd., Taichung Hsien (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/490,724

(22) Filed: Jan. 25, 2000

(30) Foreign Application Priority Data

Nov. 8, 1999 (TW) .............................................. 088119455

(51) Int. Cl.[7] ......................... H01L 23/495; H01L 23/28; H01L 23/48
(52) U.S. Cl. ......................... 257/666; 257/676; 257/675; 257/692; 257/684; 257/796; 257/712; 257/696; 257/693; 257/698
(58) Field of Search .................................. 257/666, 676, 257/675, 692, 693, 684, 706–713, 717, 720, 796, 696, 698

(56) References Cited

U.S. PATENT DOCUMENTS

| | | | |
|---|---|---|---|
| 4,910,583 | * 3/1990 | Behr et al. | |
| 5,028,741 | * 7/1991 | Sanders et al. | 174/52.2 |
| 5,065,281 | * 11/1991 | Hernandez et al. | 361/388 |
| 5,177,669 | * 1/1993 | Juskey et al. | 257/675 |
| 5,206,713 | * 4/1993 | McGeary | 257/684 |
| 5,289,344 | * 2/1994 | Gagnon et al. | 257/675 |
| 5,345,106 | * 9/1994 | Doering et al. | 257/675 |
| 5,379,187 | * 1/1995 | Lee et al. | 257/720 |
| 5,381,042 | * 1/1995 | Lerner et al. | 257/712 |
| 5,583,371 | * 12/1996 | Hori | 257/675 |
| 5,583,377 | * 12/1996 | Higgins, III | 257/707 |
| 5,790,378 | * 8/1998 | Chillara | 257/675 |
| 5,903,052 | * 5/1999 | Chen et al. | 257/706 |
| 5,929,514 | * 7/1999 | Yalamanchili | 257/676 |
| 6,159,764 | * 12/2000 | Kinsman et al. | 438/106 |
| 6,159,770 | * 12/2000 | Tetaka et al. | 438/112 |
| 6,198,171 | * 3/2001 | Huang et al. | 257/676 |

* cited by examiner

*Primary Examiner*—Alexander O Williams
(74) *Attorney, Agent, or Firm*—Jiawei Huang; J.C. Patents

(57) ABSTRACT

A semiconductor package structure having universal lead frame and heat sink comprises a chip, a lead frame, a heat sink, a bonding wire, and a molding compound. The leads of the lead frame approaches toward the center portion of the lead frame in order to adapt to various sizes of the chip. The heat sink is mounted on and connected to the leads of the lead frame, and the periphery of the heat sink overlaps the front end of the leads wherein the dimension of the heat sink is not smaller than the size of the chip. The chip is disposed on the heat sink that is also functioned as die pad. The chip is electrically connected to the leads by a bonding wire that is designed to be the shortest. An "electrically insulative, and thermally conductive layer" is employed for bonding the heat sink to the lead frame. A molding compound is employed to encapsulate the chip, a portion or the whole piece of the heat sink, the leads of the lead frame, and the bonding wires that are electrically connected between the chip and the leads.

9 Claims, 4 Drawing Sheets

SEMICONDUCTOR PACKAGE STRUCTURE HAVING UNIVERSAL LEAD FRAME AND HEAT SINK

CROSS-REFERENCE TO RELATED APPLICATION

This application claims the priority benefit of Taiwan application serial no. 88119455, filed Nov. 8, 1999.

BACKGROUND OF THE INVENTION

1. Field of the Invention

This invention relates to semiconductor package structure, and more particularly to a semiconductor package structure having universal lead frame and heat sink.

2. Description of Related Art

In the semiconductor industry, the semiconductor packaging, being the last stage of manufacturing process of integrated circuit products, is used for providing a medium of electrical connection between a chip and a printed circuit board (PCB) or other appropriate devices and is also used to protect the chip. Generally, the integrated circuit is encapsulated in a package, then the package is bonded to the printed circuit board or a substrate.

It is the demand of the market makes the semiconductor industry grow very fast, and the level of integration of integrated circuit is getting higher than ever. Consequently, the number of input/output port is increasing, and the package is heading for developing the one with high density. Therefore, the design and fabrication of a die pad used for mounting the chip while performing packaging, and of a printed circuit board or a substrate such as a circuit carrier for the connection of electronic parts needs to be improved. As the speed of calculating process is getting higher and higher, the power consumed and the heat generated is also getting higher and higher. The heat generated after the chip is packaged is not easy to spread away. The conventional way of heat dissipation is to let the heat dissipate by means of the heat conduction through the molding compound, but the molding compound universally used is not a good thermally conductive material. For all of the above-mentioned reasons, the heat-dissipating effect of heat dissipation method provided by the conventional package is very limited.

FIG. 1A is a cross-sectional view of a semiconductor package according to the prior art. As shown in FIG. 1A, a semiconductor package is constructed on a leaf frame 106. The package comprises a die pad 102 having a top surface 104, and a plurality of leads 108. The leads 108 are attached on the top surface 104 and are disposed at the periphery of the die pad 102. A chip 100*a* mounted on the top surface 104 of the die pad 102 is electrically connected to the leads 108 by bonding wires 110*a*.

As the manufacturing technology of the semiconductor has advanced to 0.18 Micron of wire width or even smaller, there are a lot of breakthrough on increasing the integration. Accordingly, the chip size is diminished, and the electronic products are in the trend of "Light, Thin, Short, and Small". However, as the chip is shrunk, under the same condition of using the same lead frame, the distance between the chip and the leads of the lead frame will be increased.

Similar to FIG. 1A, shown in FIG. 1B is a schematic cross-sectional view of the semiconductor according to the prior art when the chip is shrunk. As shown in FIG. 1B, a chip 100*b* mounted on the top surface 104 of the die pad 102 is electrically connected to the leads 108 by bonding wires 110*b*. As compare with the package shown in FIG. 1A, when the chip is shrunk from 100*a* to 100*b* while all the other elements of the package keep the same size and same disposition, the required bonding wires become longer from 100*a* to 100*b*. This is due to the fact that the space between the chip 100*b* and the leads 108 in FIG. 1B is larger than the space between the chip 100*a* and the leads 108 in FIG. 1A. The length increase of bonding wires not only increases the manufacturing cost but also affects the electrical performance of the package. Moreover, the encapsulating process can cause the "Wire Sweep" or even the "Wire Cross" of the relatively long bonding wire that results in unnecessary "Short Circuit".

However, one way to keep the length of the bonding wires unchanged when the chip is shrunk from 100*a* to 100*b* is to make the leads approach toward the center of the lead frame, in other word, to make the leads relatively longer. Accordingly, the lead frame needs to be redesigned and remanufactured which will result in the increase in manufacturing cost too. In other word, the original lead frame can not be used when the size of the chip is changed (either shrunk or enlarged).

SUMMARY OF THE INVENTION

Therefore, it is the objective of the present invention to provide a semiconductor package structure having universal lead frame and heat sink to accommodate different sizes of the chip. Whenever there is a change in the dimension of the chip, the packaging process can be performed without making any changes in the design and manufacturing of new lead frames, in other word, the original lead frames still hold good. Moreover, the bonding wire electrically collecting the chip and the leads of the lead frame is the shortest one, thereby, it can enhance the electrical performance and the reliability of the overall package. In additions, there is a heat sink in the package that can dissipate the heat generated, and the heat sink is employed to substitute for the die pad for chip mounting. Furthermore, the heat sink can be exposed to directly contact the outside elements to facilitate the package to transfer the heat out, thereby, two kinds of this type of packages are available, i.e., Die Pad Heat Sink (DPH) structures and Exposed Die Pad Heat Sinks (EDPH).

In order to attain the foregoing and other objectives, the present invention provides a semiconductor package structure having universal lead frame and heat sink. The semiconductor package structure comprises a chip, a lead frame, a heat sink, a bonding wire, and a molding compound. The leads of the lead frame approaches toward the center portion of the lead frame in order to adapt to various sizes of the chip. The heat sink is mounted on and connected to the leads of the lead frame, and the periphery of the heat sink overlaps the front end of the leads wherein the dimension of the heat sink is not smaller than the size of the chip. The chip is mounted on the heat sink that is also functioned as die pad. The chip is electrically connected to the leads by a bonding wire that is designed to be the shortest. An "electrically insulative, and thermally conductive" layer is employed for bonding the heat sink to the lead frame. A molding compound is employed to encapsulate the chip, a portion or the whole piece of the heat sink, the leads of the lead frame.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1A:
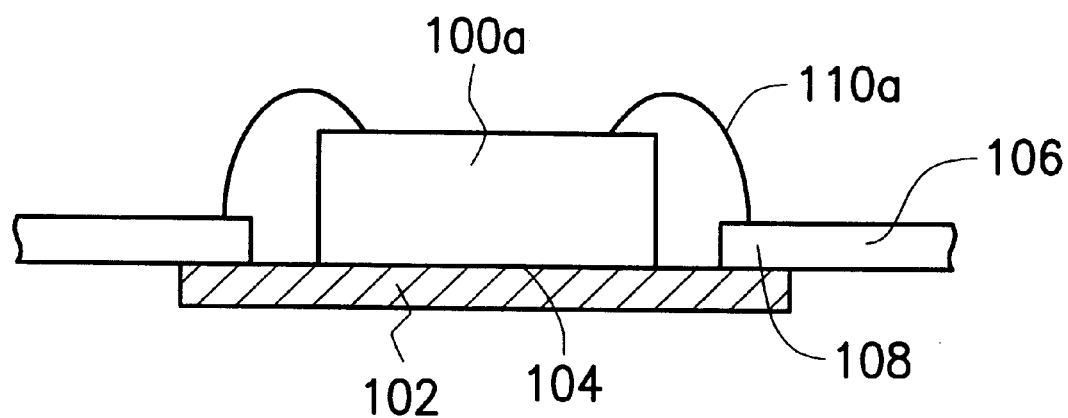
FIG. 1A is a schematic cross-sectional view of a semiconductor package according to the prior art.
Figure 1B:
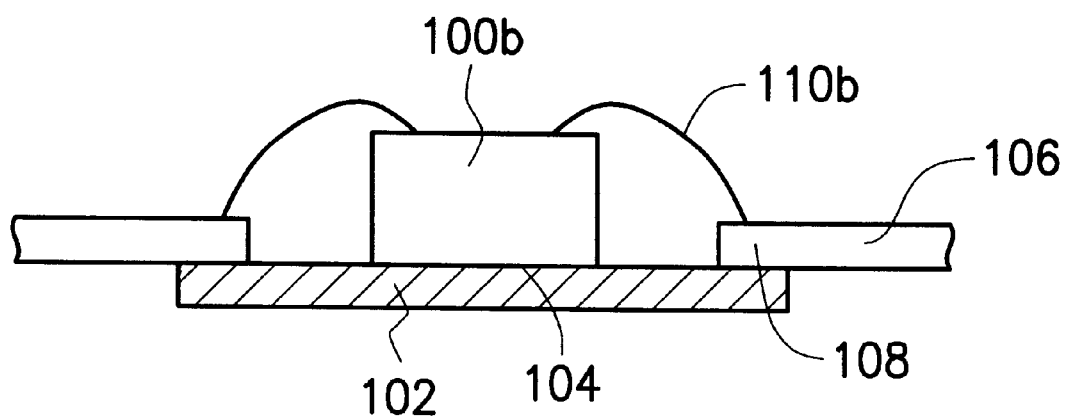
FIG. 1B is a schematic cross-sectional view of the semiconductor according to the prior art when the chip is shrunk.
Figure 2A:
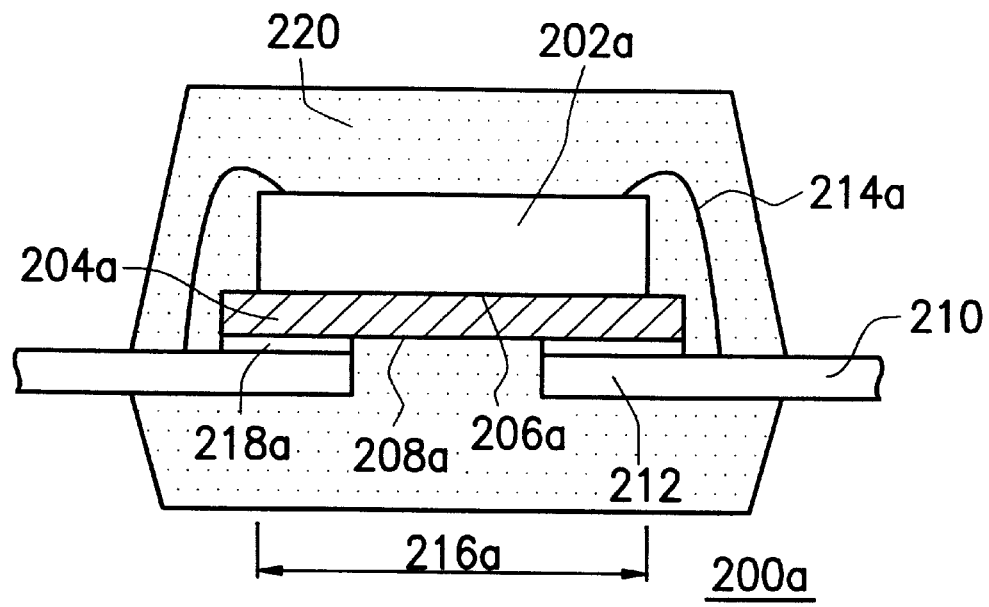
FIG. 2A is a schematic cross-sectional view of a semiconductor package having universal lead frame and heat sink of the first preferred embodiment according to the present invention.

The First Preferred Embodiment:

Shown in FIG. 2A is a schematic cross-sectional view of a semiconductor package having universal lead frame and heat sink of the first preferred embodiment according to the present invention. As shown in FIG. 2A, a semiconductor package 200a is constructed on a lead frame 210. The package 200a comprises a heat sink 204a and a plurality of leads 212. The heat sink 204a that is functioned as a die pad has a first surface 206a and a second surface 208a. The leads 212 are designed to be long enough to be approached to the center of the lead frame 210 in order to be attached on by the heat sink 204a. Thus, the heat sink 204a can have its second surface 208a mounted at the inner periphery of the lead frame 210 and on the top surface of the leads 212 by an adhesive 218a. Preferably, the material of the heat sink 204a is aluminum or copper while that of the adhesive 218a is "an electrically insulative and thermally conductive paste".

A chip 202a that is mounted on the heat sink 204a is electrically connected to the leads 212 with the bonding wires 214a by Wire Bonding method for instance. Preferably, the material of the bonding wires 214a is gold wire, aluminum wire etc. A molding compound 220 is employed to encapsulate the chip 202a, the heat sink 204a, the bonding wires 214a and the leads 212 to accomplish a package 200a. The preferred material for the molding compound 220 is an electrically insulative molding compound such as Resin, Epoxy etc.

As mentioned above, the heat sink 204a in the first embodiment of the present invention is functioned as a die pad, in other word, the package 200a is a kind of "Die Pad Heat Sink" (DPH) structure. The heat generated in the chip 202a is dissipated through a path of the heat sink 204a, the adhesive 218a, and the leads 212 of the lead frame 210 to be transferred out of the package 200a.

Normally the dimension of the die pad, which is the heat sink 204a in the present invention, is designed to be larger than the dimension of the chip 202a. Noted that the bonding wire 214a is designed to be the shortest one connected between the chip 202a and the lead 212. To achieve this object, the lead 212 is disposed in a way such that the leads 212 is approached sufficiently toward the center of the lead frame 210 to be overlapped with the length of the chip 202a. Moreover, the leads 212 and the chip 202a are on the distinct sides of the heat sink 204a to enable this overlapping.

Figure 2B:
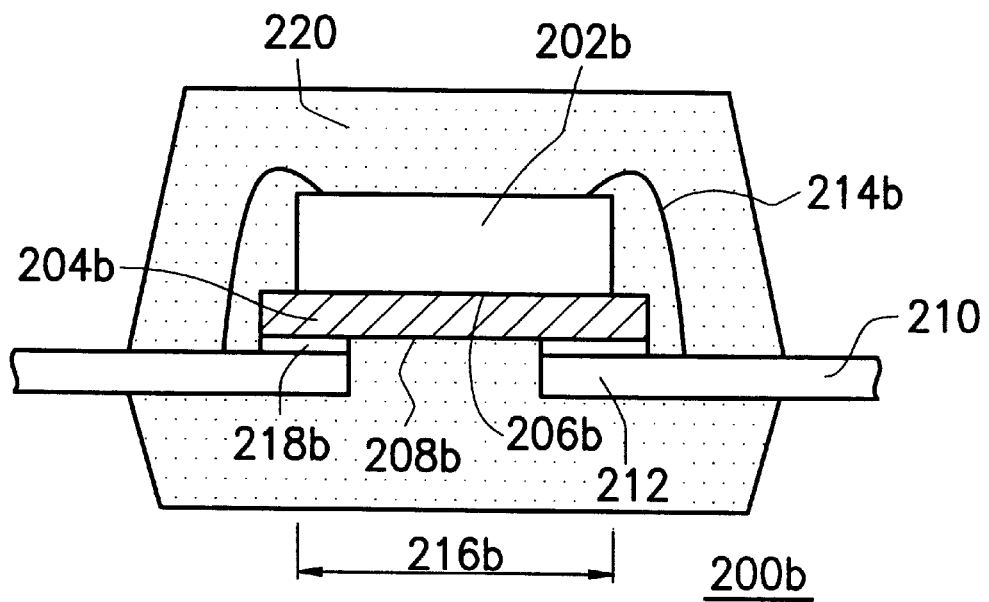
FIG. 2B is a schematic cross-sectional view of a semiconductor package having universal lead frame and heat sink of the first preferred embodiment when the chip is shrunk according to the present invention.

Shown in FIG. 2B is a schematic cross-sectional view of a semiconductor package having universal lead frame and heat sink of the first preferred embodiment when the dimension of the chip is shrunk according to the present invention. As shown in FIG. 2B, a semiconductor package 200b is constructed on a lead frame 210. The package 200b comprises a heat sink 204b and a plurality of leads 212. The heat sink 204b that is functioned as a die pad has a first surface 206b and a second surface 208b. Shown in FIG. 2B is a package structure 200b similar to the package structure 200a of FIG. 2A. When the dimension of the chip 202b is shrunk, the dimension of the heat sink 204b is shrunk accordingly but the dimension of the heat sink 204b still larger than that of the chip 202b. The heat sink 204b has its second surface 208b mounted at the inner periphery of the lead frame 210 and on the top surface of the leads 212 by an adhesive 218b. Preferably, the material of the heat sink 204b is aluminum or copper while that of the adhesive 218b is "an electrically insulative and thermally conductive paste".

A chip 202b that is mounted on the heat sink 204b is electrically connected to the leads 212 with the bonding wires 214b by Wire Bonding method for instance. Preferably, the material of the bonding wires 214b is gold wire, aluminum wire etc. A molding compound 220 is employed to encapsulate the chip 202b, the heat sink 204b, the bonding wires 214b and the leads 212 to accomplish a package 200b. The preferred material for the molding compound 220 is an electrically insulative molding compound such as Resin, Epoxy etc.

Moreover, the length of the lead frame 210 is the same as that of the lead frame 210 shown in FIG. 2A, and the length of the bonding wires 214b is also the same as that of the bonding wires 214a in FIG. 2A. What is different is the overlapped length, that is, the overlapped length between the heat sink 204b and the lead frame 210 in FIG. 2B is smaller than the overlapped length between the heat sink 204a and the lead frame 210 in FIG. 2A. In other word, when the dimension of the chip is shrunk, all one has to do is use a relatively small dimension of the heat sink accordingly while still use the same lead frame and the same bonding wires.

Figure 3A:
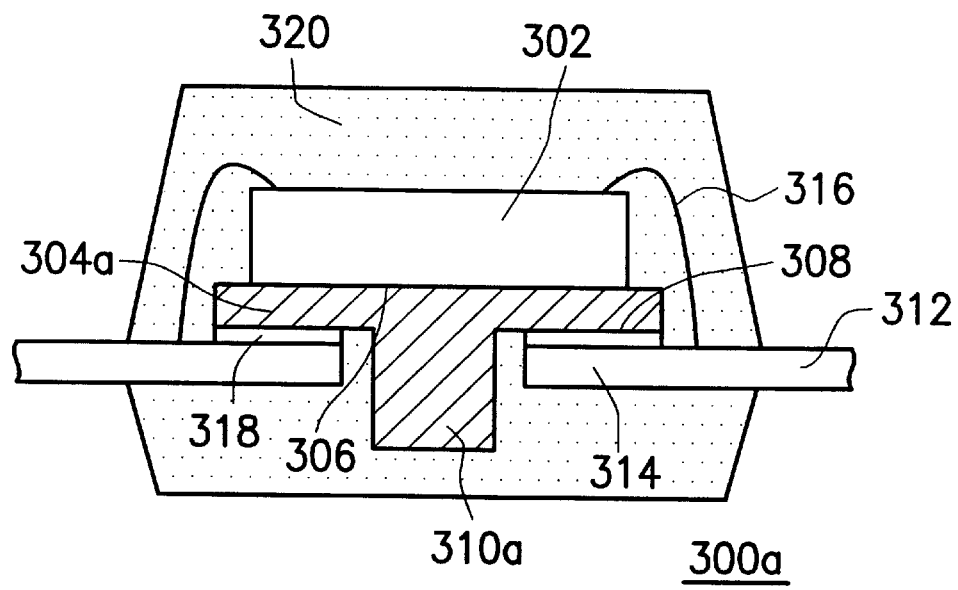
FIG. 3A is a schematic cross-sectional view of a semiconductor package having universal lead frame and heat sink of the second preferred embodiment according to the present invention.

The Second Preferred Embodiment:

Shown in FIG. 3A is a schematic cross-sectional view of a semiconductor package having universal lead frame and heat sink of the second preferred embodiment according to the present invention. As shown in FIG. 3A, a semiconductor package 300a is constructed on a lead frame 312. The package 300a comprises a heat sink 304a and a plurality of leads 316. The heat sink 304a that is functioned as a die pad has a first surface 306 and a second surface 308. The heat sink 304a also has a projection 310a added to the center portion of its second surface 308 and disposed at the opening center region of the lead frame 312. The leads 314 are designed to be long enough to be approached to the center of the lead frame 312 in order to be attached on by the heat sink 304a. Thus, the heat sink 304a can have its second surface 308 mounted at the inner periphery of the lead frame 312 and on the top surface of the leads 314 by an adhesive 318. Preferably, the material of the heat sink 304a is aluminum or copper while that of the adhesive 318 is "an electrically insulative and thermally conductive paste".

A chip 302 that is mounted on the heat sink 304a is electrically connected to the leads 314 by the bonding wires 316 by Wire Bonding method for instance. Preferably, the material of the bonding wires 316 is gold wire, aluminum wire etc. A molding compound 320 is employed to encapsulate the chip 302, the heat sink 304a, the bonding wires 316 and the leads 314 to accomplish a package 300a. Since the package 300a contains a heat sink 304a that is functioned as a die pad as mentioned above, thereby, the package 300a is a kind of Die Pad Heat Sink (DPH) structure. The preferred material for the molding compound 320 is an electrically insulative molding compound such as Resin, Epoxy etc.

The heat generated in the chip 302 is dissipated through a path of the heat sink 304a, the adhesive 318, and the leads 314 of the lead frame 312 to be transferred out of the package 300a. Moreover, the leads 314 and the chip 302 are on the opposite sides of the heat sink 304a to enable the overlapping between the leads 314 and the chip 302. This overlapping will enable the design of the bonding wires 316 to be the shortest one connected between the chip 302 and the lead 314 as mentioned before.

As mentioned above, the heat sink 304a functioned as a die pad has a projection structure 310a added. The heat sink 304a together with the projection 310a can increase the heat-dissipating area so as to provide a relatively better heat-dissipating effect. Moreover, the projection can be used to balance the mold flow during the encapsulating process, thus the packaging reliability can be enhanced by the use of "balanced mold flow" method.

Figure 3B:
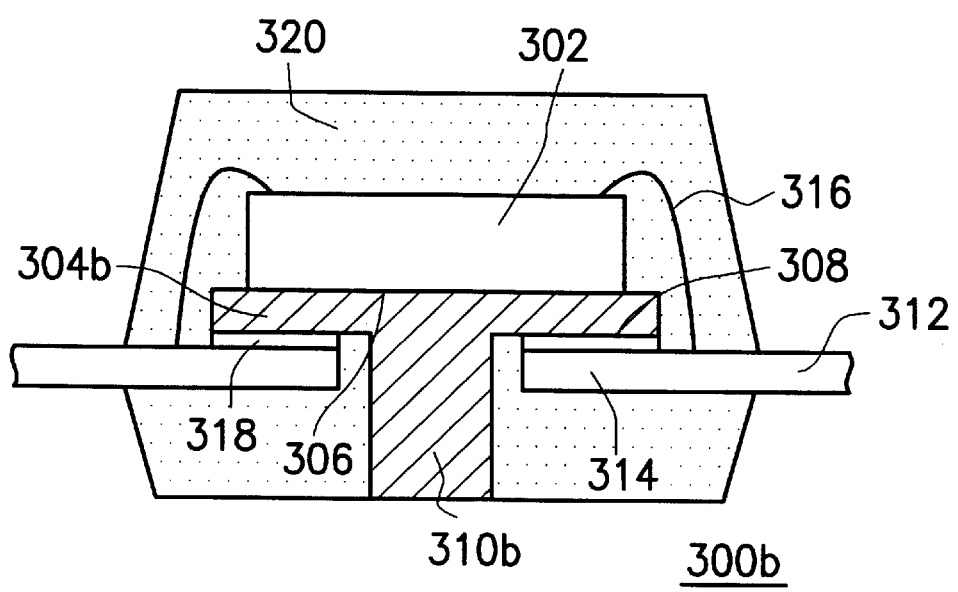
FIG. 3B is a schematic cross-sectional view of a semiconductor package having universal lead frame and heat sink and having the EDPH structure of the second preferred embodiment according to the present invention.

FIG. 3B is a schematic cross-sectional view of another semiconductor package having universal lead frame and heat sink and having the EDPH structure of the second preferred embodiment according to the present invention. The package structure 300b in FIG. 3B is exactly the same as a package structure 300a in FIG. 3A, and same element numbers are used except that the projection 310b added is exposed. An "exposed projection" 310b is added to the heat sink 304b at the center portion of its second surface 308 and is disposed at the opening center region of the lead frame 312 similar to the projection 310a in FIG. 3A. The difference is that the projection 310b as shown in FIG. 3B has its bottom surface expose to the bottom surface of the package 300b, thereby, the package 300b is a kind of "Exposed Die Pad Heat Sink" (EDPH) structure. As compare with the package structure 300a in FIG. 3A, an extra heat-dissipating path is added to the package structure 300b in FIG. 3B. That is, a path from the chip 302 through the heat sink 304b, and the "exposed projection 310b". Consequently, the heat-dissipating effect of the package 300b can be enhanced further.

Figure 3C:
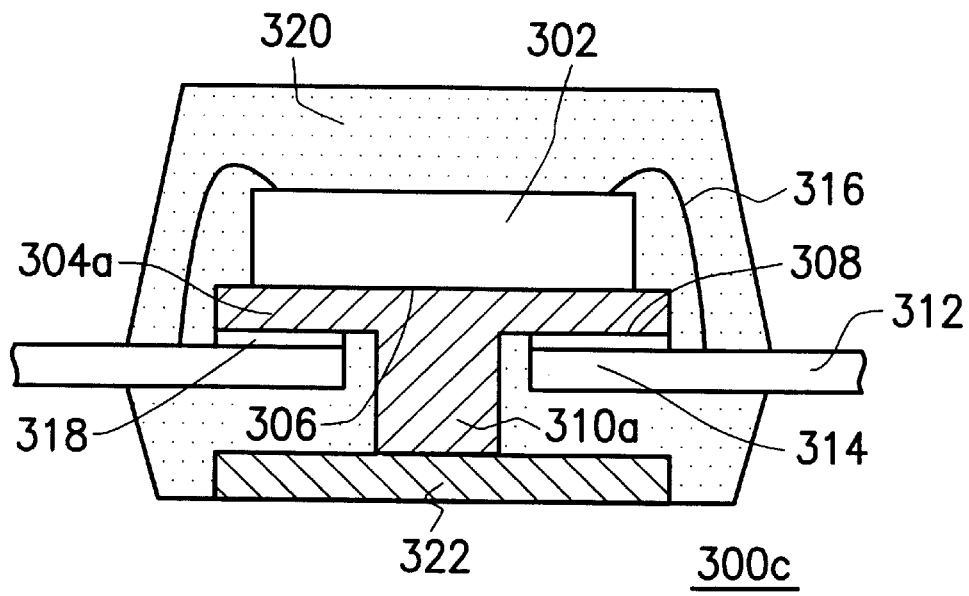
FIG. 3C is a schematic cross-sectional view of another semiconductor package having universal lead frame and heat sink, and having the DPH and heat spreader structure of the second preferred embodiment according to the present invention.

FIG. 3C is a schematic cross-sectional view of one other semiconductor package having universal lead frame and heat sink and having the EDPH structure of the second preferred embodiment according to the present invention. The package structure 300c in FIG. 3C is exactly the same as a package structure 300a in FIG. 3A, and same element numbers are used except that a heat spreader 322 which has its bottom surface exposed is added to the bottom surface of the projection 310a. As shown in FIG. 3C, an "exposed heat spreader" 322 is added to the projection 310a at the opening center region of the lead frame 312. The heat spreader 322 has its bottom surface exposed at the bottom surface of the package 300c. An extra heat-dissipating path from the chip 302 through the heat sink 304a and the heat spreader 322 is then created. This heat spreader has a much larger area exposed, thereby, the heat-dissipating effect of the package 300c will be significantly improved.

Figure 4:
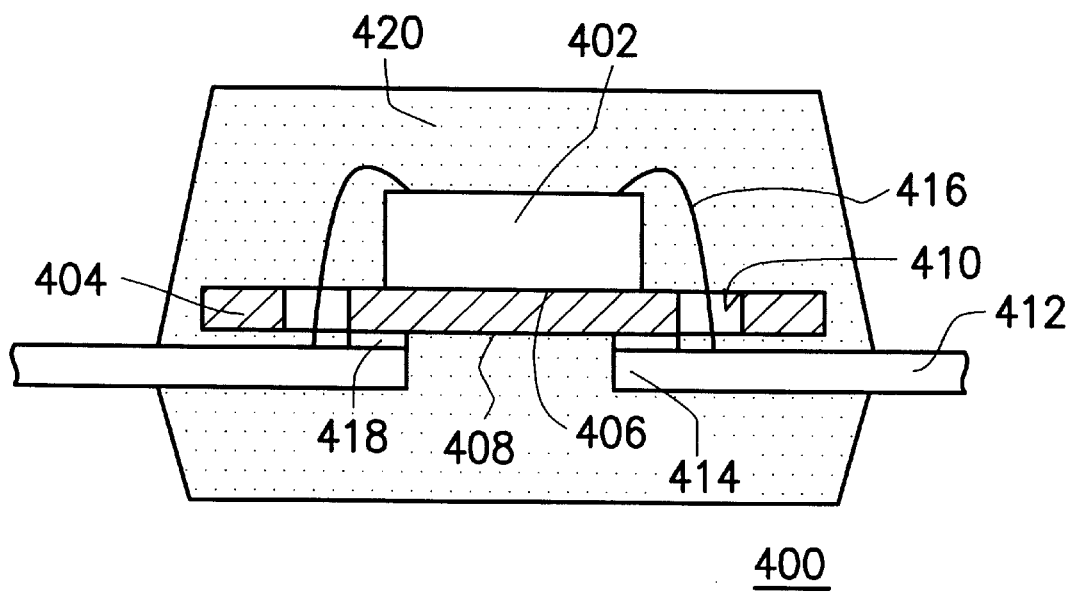
FIG. 4 is a schematic cross-sectional view of a semiconductor package having universal lead frame and heat sink of the third preferred embodiment according to the present invention.

The Third Preferred Embodiment:

FIG. 4 is a schematic cross-sectional view of one other semiconductor package having universal lead frame and heat sink of the third preferred embodiment according to the present invention. This package structure is similar to the package structure of the first embodiment shown in FIG. 2. As shown in FIG. 4, a semiconductor package 400 is constructed on a lead frame 412. The package 400 comprises a heat sink 404 and a plurality of leads 414. The heat sink 404 that is functioned as a die pad has a first surface 406 and a second surface 408. The leads 414 are designed to be long enough to be approached to the center of the lead frame 412 in order to be attached on by the heat sink 404. Thus, the heat sink 404 can have its second surface 408 mounted at the inner periphery of the lead frame 412 and on the top surface of the leads 414 by an adhesive 418. Preferably, the material of the heat sink 404 is aluminum or copper while that of the adhesive 418 is an "electrically insulative and thermally conductive paste".

A chip 402 that is mounted on the heat sink 404 is electrically connected to the leads 414 with a plurality of bonding wires 416 by Wire Bonding method for instance. Preferably, the material of the bonding wires 416 is gold wire, aluminum wire etc. A molding compound 420 is employed to encapsulate the chip 402, the heat sink 404, the bonding wires 416 and the leads 414 to accomplish a package 400. The preferred material for the molding compound 420 is an electrically insulative molding compound such as Resin, Epoxy etc.

As one can see both in FIG. 2A and FIG. 2B in the first embodiment of the present invention, when the chip is shrunk from 202a to 202b, the dimension of the heat sink is decreased from 204a to 204b accordingly. This is for the sake of keeping the length of the bonding wires 214b and 214a unchanged instead of increasing the wire length. In other word, if the heat sink 204b keeps the same dimension as that of the heat sink 204a, the bonding wires 214b have to be increased to be greater than those of the bonding wires 214a. This will enable the bonding wires 214b to electrically connect the chip 202b to the leads 212. Consequently, the manufacturing cost will be high since the bonding wire is rather expensive.

As the heat sink is shrunk as shown in FIG. 2B, the heat-dissipating area become relatively smaller. In this situation, the disadvantage of decreasing the heat-dissipating area of the heat sink is traded for the advantage of saving the cost of not using a relatively long bonding wire.

However, there is a way to cover both of the above-mentioned advantages. This is shown in FIG. 4 in the present embodiment of the present invention. A plurality of via holes 410 is disposed on the perimeter of the heat sink 404 at the locations where the bonding wires needed to be penetrated through for electrically connecting the chip 402 to the leads 414. Therefore, when the dimension of the chip is decreased, the bonding wires 316 electrically connected between the chip 302 and the lead 314 are penetrated through the via holes 410 without making the dimension of the heat sink 404 shorter while the length of bonding wires can still keep the same.

Likewise, an adhesive 418 is employed to bond the second surface 408 of the heat sink 404 to the leads 414. The preferred adhesive 418 is an "electrically insulative, and thermally conductive paste" etc. Besides, the chip 402, the heat sink 404, the leads 414 of the lead frame 412, bonding wire 416, and a portion of the lead frame 412 are all encapsulated by a molding compound 420.

Therefore, the package of the present invention can make the length of the bonding wires the shortest one. Besides, when the dimension of the chip is shrunk, the same structural members, such as heat sink and lead frame, can still be used by changing only the location of the "via holes" on the heat sink.

To summarize the foregoing illustration disclosed by preferred embodiments of the present invention, the semiconductor package of the present invention comprise the following advantages:

1. When the dimension of the chip is changed, by employing the semiconductor package having universal lead frame and heat sink of the present invention, the original lead frame can be used for performing packaging without redesign and remanufacturing new lead frames. All one has to do is to change the dimension of the heat sink. In this way, one can keep the length of the bonding wires unchanged and the shortest ones without shortening the dimension of the heat sink so as to enhance the electrical performance and reliability of the overall package.

2. The semiconductor package having universal lead frame and heat sink of the present invention has either a DPH structure or a EDPH structure. Therefore, the heat generated by the chip can be transferred out of the package through an effective heat path. The heat path is passing through the heat sink functioned as die pad, the thermal conductive paste, the lead frame, and heat spreader etc. in order to enhance the heat-dissipating efficiency and the reliability of the device, and to prolong the service life of the device.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A semiconductor package comprising:
   a leadframe, having a plurality of leads approaching toward a central portion of the leadframe;
   a heat sink, having a first surface, a second surface and a plurality of via holes that divide the heat sink into an outer part and an inner part, wherein the second surface in the inner part of the heat sink is bonded to the leads that underlie thereof;
   a chip, mounted on the first surface of the heat sink, wherein the chip has a dimensional profile that overlaps the plurality of leads and the area of the first surface of the heat sink is not smaller than the area of the chip;
   a plurality of bonding wires, extending through the via holes of the heat sink to electrically connect the chip to the leads respectively; and
   a molding compound, encapsulating the chip, the bonding wires, the heat sink and the leads.

2. The semiconductor package of claim 1 further comprising an adhesive used for bonding the heat sink and the lead frame.

3. The semiconductor package of claim 2 wherein the adhesive comprises an electrically insulative, and thermally conductive paste.

4. A semiconductor package comprising:
   a leadframe, having a plurality of leads approaching toward a central portion of the leadframe to define an opening in the leadframe;
   a heat sink, having a first surface, a second surface, and a projection, wherein the projection centrally protrudes from the second surface through the opening of the leadframe, and the second surface has a peripheral portion that overlaps the leads proximate to the opening of the central portion of the leadframe;
   an "electrically insulative and thermally conductive layer" that bonds the heat sink by the peripheral portion of the second surface thereof to the leads in the central portion of the leadframe;
   a chip, mounted on the first surface of the heat sink, wherein the chip has a dimensional profile that overlaps the plurality of leads and the area of the first surface of the heat sink is not smaller than the area of the chip;
   a plurality of bonding wires, electrically connecting the chip to the leads at the upper surface thereof, respectively; and
   a molding compound, encapsulating the chip, the bonding wires, the heat sink, the leads, and at least a portion of the projection.

5. The semiconductor package of claim 4, wherein the projection has a bottom surface exposed without being encapsulated by the molding compound.

6. The semiconductor package of claim 4, wherein the projection has a bottom surface further connected to a plate of heat spreader exposed to air.

7. A semiconductor package comprising:
   a leadframe, having a plurality of leads approaching toward a central portion of the leadframe to define an opening therein;
   a heat sink, comprising of a first part that extends centrally through the opening of the leadframe into a second part such that the first part is larger than the second part, wherein the first part of the heat sink has a mounting surface, and a peripheral portion that overlaps the leads proximately to the opening of the leadframe;
   an adhesive layer, bonding the leads to the heat sink by the peripheral portion thereof;
   a chip, mounted on the mounting surface of the heat sink, wherein the chip has a dimensional profile that overlaps the plurality of leads and the area of the mounting surface of the heat sink is not smaller than the area of the chip;
   a plurality of bonding wires, electrically connecting the chip to the leads; and
   a molding compound, encapsulating at least the chip, the bonding wires, the leads, and the heat sink.

8. The semiconductor package of claim 7, wherein the second part of the heat sink has one bottom surface exposed by the molding compound.

9. The semiconductor package of claim 7, wherein the semiconductor package further comprises a plate of heat spreader that has a bottom surface, wherein the second part of the heat sink is in contact with the plate of heat spreader while the molding compound also encapsulates the plate of heat spreader such that the bottom surface thereof is exposed to air.

* * * * *